(12) United States Patent
Zai et al.

(10) Patent No.: US 10,541,658 B2
(45) Date of Patent: Jan. 21, 2020

(54) POWER AMPLIFIER OPERATION

(71) Applicant: Massachusetts Institute of Technology, Cambridge, MA (US)

(72) Inventors: Andrew H. Zai, Sudbury, MA (US); Michael D. Lockard, Norwood, MA (US); Kenneth E. Kolodziej, Lexington, MA (US); Jeffrey S. Herd, Rowley, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 15/843,730

(22) Filed: Dec. 15, 2017

(65) Prior Publication Data

US 2018/0175809 A1    Jun. 21, 2018

Related U.S. Application Data

(60) Provisional application No. 62/434,590, filed on Dec. 15, 2016.

(51) Int. Cl.
*H03G 3/20* (2006.01)
*H03F 1/32* (2006.01)
(Continued)

(52) U.S. Cl.
CPC ......... *H03F 1/3247* (2013.01); *H03F 1/0222* (2013.01); *H03F 1/0283* (2013.01);
(Continued)

(58) Field of Classification Search
CPC ..... H03F 1/0222; H03F 1/0227; H03F 1/0238
(Continued)

(56) References Cited

U.S. PATENT DOCUMENTS

| 7,026,868 | B2 * | 4/2006 | Robinson | H03F 1/0227 |
| | | | | 330/10 |
| 8,643,435 | B2 * | 2/2014 | Lim | H03F 1/0227 |
| | | | | 330/136 |

(Continued)

OTHER PUBLICATIONS

Asbeck, P., et al., "ET Comes of Age: Envelope Tracking for Higher-Efficiency Power Amplifiers," in IEEE Microwave Magazine, vol. 17, No. 3, pp. 16-25, Mar. 2016.
(Continued)

*Primary Examiner* — Steven J Mottola
(74) *Attorney, Agent, or Firm* — Schmeiser, Olsen & Watts LLP; V. Raman Bharatula

(57) ABSTRACT

Systems and methods for improving power amplifier operation are provided. A system may include a baseband signal generator communicatively coupled to a baseband signal digital-to-analog converter. The baseband signal digital-to-analog converter may be communicatively coupled to two or more power amplifiers. The system may also include an envelope signal generator communicatively coupled to an envelope signal digital-to-analog converter. The system may further include a supply modulator communicatively coupled to the envelope signal digital-to-analog converter and the two or more power amplifiers for shared envelope tracking across the two or more power amplifiers.

19 Claims, 8 Drawing Sheets

(51) Int. Cl.
  H03F 3/68    (2006.01)
  H03F 1/02    (2006.01)
  H03F 3/19    (2006.01)
  H04B 1/04    (2006.01)
  H03F 3/24    (2006.01)
  H04B 1/403   (2015.01)

(52) U.S. Cl.
  CPC .............. *H03F 3/19* (2013.01); *H03F 3/245* (2013.01); *H03F 3/68* (2013.01); *H04B 1/0458* (2013.01); *H04B 1/0475* (2013.01); *H04B 1/0483* (2013.01); *H04B 1/406* (2013.01); *H03F 2200/102* (2013.01); *H03F 2200/451* (2013.01); *H03F 2201/3233* (2013.01)

(58) Field of Classification Search
  USPC ......................................... 330/127, 136, 297
  See application file for complete search history.

(56) References Cited

U.S. PATENT DOCUMENTS

| | | |
|---|---|---|
| 2011/0151806 A1 | 6/2011 | Kenington |
| 2012/0236965 A1 | 9/2012 | Muhammad |
| 2014/0269986 A1 | 9/2014 | Nagode et al. |
| 2015/0280795 A1 | 10/2015 | Wimpenny |
| 2016/0050629 A1 | 2/2016 | Khesbak et al. |
| 2016/0285481 A1* | 9/2016 | Cohen ...................... H01Q 3/34 |

OTHER PUBLICATIONS

Hanington, G., et al., "High-efficiency power amplifier using dynamic power-supply voltage for CDMA applications," in IEEE Transactions on Microwave Theory and Techniques, vol. 47, No. 8, pp. 1471-1476, Aug. 1999.

Yan, J.J., et al., "A High Efficiency 780 MHz GaN Envelope Tracking Power Amplifier," 2012 IEEE Compound Semiconductor Integrated Circuit Symposium (CSICS), LaJolla, CA, 2012, pp. 1-4.

Hoversten, J., et al., "Codesign of PA, Supply, and Signal Processing for Linear Supply-Modulated RF Transmitters," In IEEE Transactions on Microwave Theory and Techniques, vol. 60, No. 6, pp. 2010-2020, Jun. 2012.

Kimball, D.F., et al., "High-Efficiency Envelope-Tracking W-CDMA Base-Station Amplifier Using GaN HFETs," in IEEE Transactions on Microwave Theory and Techniques, vol. 54, No. 11, pp. 3848-3856, Nov. 2006.

Talisa, S.H., et al., "Benefits of Digital Phased Array Radars," in Proceedings of the IEEE, vol. 104, No. 3, pp. 530-543, Mar. 2016.

Skolnik, M, "Radar Handbook: Third Edition," New York, NY, USA: McGraw-Hill, 2008, Ch. 13, pp. 13.1-13.74.

McCune, E., "Operating Modes of Dynamic Power Supply Transmitter Amplifiers," in IEEE Transactions on Microwave Theory and Techniques, vol. 62, No. 11, pp. 2511-2517, Nov. 2014.

McCune, E., "Envelope Tracking or Polar Which Is It? [Microwave Bytes]," in IEEE Microwave Magazine, vol. 13, No. 4, pp. 34-56, May-Jun. 2012.

Wang, F., et al., "An Improved Power-Added Efficiency 19-dBm Hybrid Envelope Elimination and Restoration Power Amplifier for 802.11g WLAN Applications," in IEEE Transactions on Microwave Theory and Techniques, vol. 54, No. 12, pp. 4086-4099, Dec. 2006.

Cripps, Steve C., "RF Power Amplifiers for Wireless Communications," Boston: Artech House, 2006, Print, Ch. 3, pp. 39-65.

Zai, A., et al., "Supply-Modulated Radar Transmitters With Amplitude-Modulated Pulses," in IEEE Transactions on Microwave Theory and Techniques, vol. 63, No. 9, pp. 2953-2964, Sep. 2015.

Caverly, R., et al., "High-Efficiency Power Amplifiers," IEEE Microwave Magazine, vol. 13, No. 7, pp. S22-S32, Nov. 2012.

Adam, J.A., "Pinning Defense Hopes on Aegis," Spectrum, IEEE, vol. 25, No. 6, pp. 24-27, Jun. 1988.

Chireix, H., "High Power Outphasing Modulation," Proc. IRE, vol. 23, No. 11, pp. 1370-1392, Nov. 1935.

Doherty, W.H., "A New High Efficiency Power Amplifier for Modulated Waves," Proc. IRE, vol. 24, No. 9, pp. 1163-1182, Sep. 1936.

Kahn, L.R., "Single Sideband Transmission by Envelope Elimination and Restoration," Proc. IRE, vol. 40, No. 7, pp. 803-806, Jul. 1952.

Invitation to Pay Additional Fees and, where Applicable, Protest Fee in International Patent Application No. PCT/US2017/066697, mailed on Feb. 6, 2018; 2 pages.

International Search Report and Written Opinion in International Patent Application No. PCT/US2017/066697, dated Apr. 24, 2018; 11 pages.

Zai, Andrew H., "Supply Modulation for Efficient Radar and Communications Transmitters," Power Point Presentation, University of Colorado Boulder, Boulder, Colorado, Dec. 14, 2014.

International Preliminary Report on Patentability in PCT/US2017/066697 dated Jun. 27, 2019; 8 pages.

\* cited by examiner

POWER AMPLIFIER OPERATION

RELATED APPLICATIONS

This application claims the benefit of the earlier filing date of U.S. Provisional Patent Application No. 62/434,590, filed Dec. 15, 2016 and titled "Shared Envelope Tracking for Time-Delayed Amplifiers," the entirety of which is incorporated herein by reference.

GOVERNMENT RIGHTS IN THE INVENTION

This invention was made with government support under Contract No. FA8721-05-C-0002 awarded by the U.S. Air Force. The government has certain rights in the invention.

FIELD OF THE INVENTION

The present disclosure relates generally to methods and systems for improving power amplifier operation. More particularly, the disclosure relates to methods of using one or more of shared envelope tracking and digital pre-distortion to improve power amplifier operation.

BACKGROUND OF THE INVENTION

A signal may be encoded with information and then amplified to broadcast or transmit the signal. High efficiency amplification can be performed with some systems achieving almost 60% energy efficiency. However, energy may be wasted if the system is designed for linear amplification. If linear amplification is performed, energy efficiency may drop down to as low as 10%. Linearization may be desired in order to make sure that the signal prior to amplification corresponds linearly to the signal post amplification.

In some systems, the signal itself may include content defined by amplitude modulation. For example, radar systems may have a fixed amplitude that is sent out. Other systems may use amplitude modulations to embed information into outgoing signals. Amplitude modulation may require linearity because each peak in the signal may transmit some valuable information. Thus, between the minimum and maximum values of the signal, the output of the power amplifier may need to correspond linearly to the input of the power amplifier in order to maintain integrity of the information being transmitted.

Various techniques may be used to create linear signals for communication systems or other systems or purposes. As discussed above, some systems may require substantial linearization, which may be performed at a single power amplifier. Each power amplifier may have an apparatus or multiple components surrounding the power amplifier which may allow the power amplifier to create highly linear signals. For example, a base station or phased array may use a power amplifier with a linearization circuit, but as discussed above, this may sacrifice energy efficiency. Thus, it may be desirable to have efficient high-power linear amplifiers for base stations or other communication systems. It may also be desirable to have groups of efficient high-power linear amplifiers, which may be used in, for example, phased array antenna systems.

SUMMARY

In one aspect, the present disclosure describes one or more systems for shared envelope tracking. A system may include a baseband signal generator communicatively coupled to a baseband signal digital-to-analog converter. The baseband signal digital-to-analog converter may be communicatively coupled to two or more power amplifiers. The system may also include an envelope signal generator communicatively coupled to an envelope signal digital-to-analog converter. The system may further include a supply modulator communicatively coupled to the envelope signal digital-to-analog converter and the two or more power amplifiers for shared envelope tracking across the two or more power amplifiers.

In implementations, the system may include at least one antenna communicatively coupled to at least one of the two or more power amplifiers. Each of the two or more power amplifiers may be communicatively coupled to a separate antenna. The system may also include at least one digital pre-distortion element in at least one of a baseband signal path associated with the baseband signal generator and an envelope signal path associated with the envelope signal generator. Digital pre-distortion may be applied to a signal prior to the signal reaching the baseband signal digital-to-analog converter to offset distortion in the two or more power amplifiers. Additionally, digital pre-distortion may be applied to a signal prior to the signal reaching the envelope signal digital-to-analog converter to offset distortion in the two or more power amplifiers.

In implementations, at least one time delay element may be associated with at least one of the two or more power amplifiers. A time delay may be applied to a signal prior to the signal reaching at least one of the two or more power amplifiers. Some systems may include two or more base station antennas. Each base station antenna may be communicatively coupled to at least one of the power amplifiers. Some systems may include two or more phased array antennas. Each phased array antenna may be communicatively coupled to at least one of the power amplifiers.

In another aspect, the present disclosure describes methods for shared envelope tracking. A method may include supplying a signal to two or more power amplifiers. The method may further include modulating power amplifier input across the two or more power amplifiers with a supply modulator. The supply modulator may be shared across the two or more power amplifiers for shared envelope tracking.

In implementations, the method may include transmitting the signal from at least one antenna communicatively coupled to at least one of the two or more power amplifiers. The method may also include applying digital pre-distortion to at least one of a baseband signal corresponding to the supplied signal and an envelope signal corresponding to the power amplifier input. Digital pre-distortion may be applied to the baseband signal prior to the baseband signal reaching a baseband signal digital-to-analog converter to offset distortion in the two or more power amplifiers. Additionally, digital pre-distortion may be applied to the envelope signal prior to the envelope signal reaching the envelope signal digital-to-analog converter to offset distortion in the two or more power amplifiers.

In implementations, the method may include applying a time delay to the signal so that the signal reaches one of the two or more power amplifiers later than another of the two or more two or more power amplifiers. The at least one antenna may be at least one of a base station antenna and a phased array antenna.

In another aspect, the present disclosure describes methods for offsetting distortion in power amplifiers. A method may include applying digital pre-distortion to a baseband signal prior to the baseband signal reaching a baseband signal digital-to-analog converter to offset distortion in two or more power amplifiers. Two or more antennas may each be communicatively coupled to at least one of the power amplifiers. In implementations, the method may include applying a time delay after the baseband signal reaches a baseband signal digital-to-analog converter so that a resulting signal reaches one of the two or more power amplifiers later than another of the two or more two or more power amplifiers. The two or more antennas may be least one of base station antennas and phased array antennas.

BRIEF DESCRIPTION OF THE DRAWINGS

The above and further advantages of the present disclosure may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

DETAILED DESCRIPTION

Figure 1:
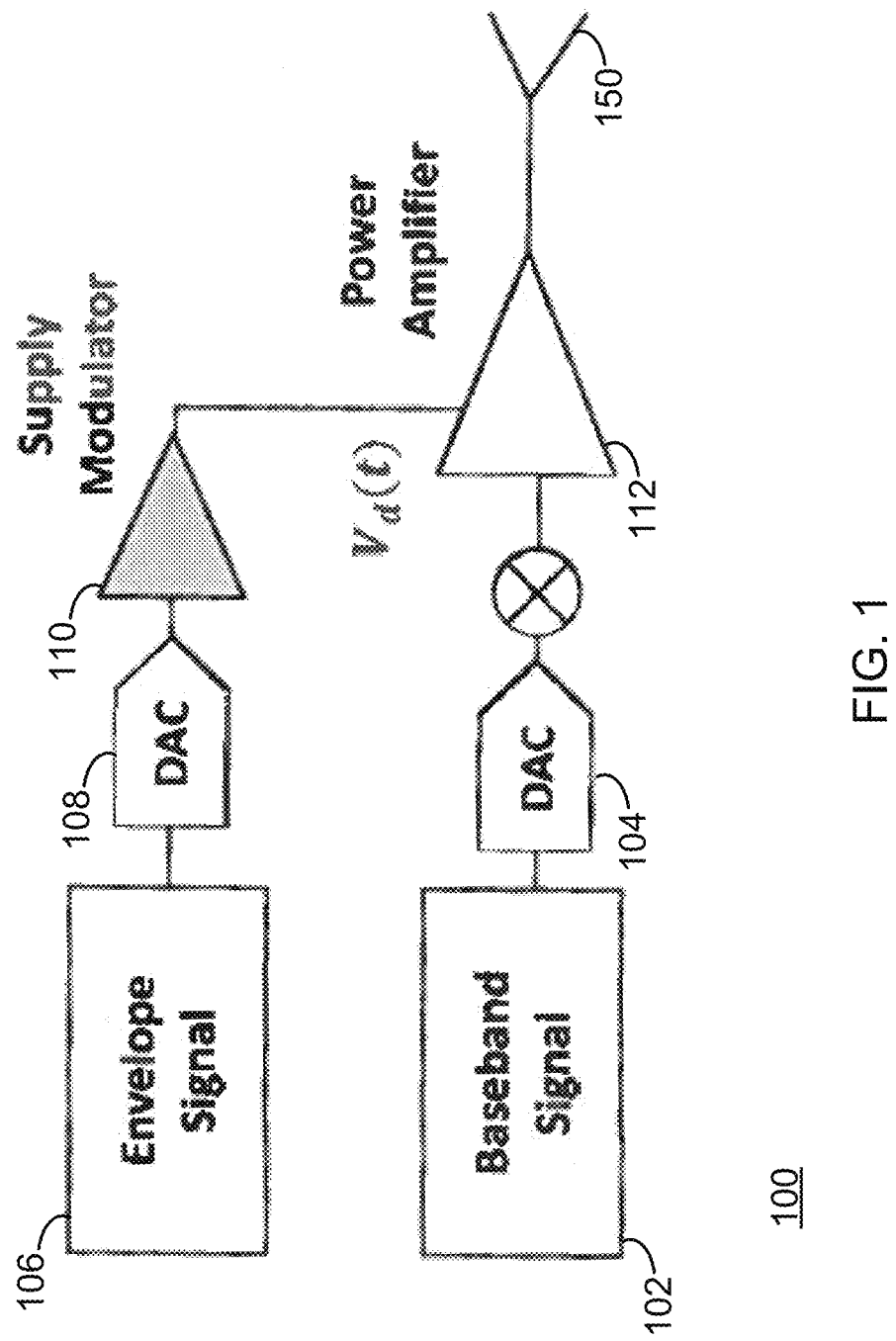
FIG. 1 shows an example architecture of an envelope tracking system in accordance with the present disclosure.

In brief overview, the techniques and features described in the present disclosure may include or be implemented in systems and methods to achieve improved power amplifier operation. More particularly, the present disclosure relates to systems and methods for shared envelope tracking and/or offsetting distortion in power amplifiers in systems that may or may not be time delayed.

As described above, it may be desirable to have efficient linear power amplifiers for communication systems. Envelope tracking may be a technique used to increase efficiency in power amplifiers. In envelope tracking, a supply modulator may be introduced to change a bias point of a power amplifier dynamically. For example, power amplifiers may have multiple terminals and one terminal may allow for supplying voltage to change the way that a signal from input to output is transformed. If a fixed value voltage is used at that supply terminal of the power amplifier and kept constant, there may not be a way to operate the power amplifier in an efficient manner while also operating in a linear fashion. With envelope tracking, a bias can be dynamically changed with a digital-to-analog converter, which dynamically changes the voltage applied with the bias. The dynamic control of the bias voltage can minimize the energy consumption of the power amplifier when operating in a linear mode. The input signal can be tracked such that the power amplifier can be dynamically adapted to the input signal. Thus, when the voltage applied is changed with a supply modulator, the power amplifier can operate linearly and also efficiently.

Supply modulation may be used as a general term to capture methods where a high speed supply is used to modulate the drain of a power amplifier (PA). It may include envelope tracking, direct polar, and hybrids of the two. A distinction may be made between envelope tracking and direct polar. Direct polar may drive the amplifier with a constant amplitude signal, keeping it in compression, and may use the drain voltage to adjust the gain of the amplifier, thus modulating the output amplitude. Envelope tracking may amplitude modulate the PA input. The PA may operate in a region of constant gain, regardless of drain supply. Because of this, the drain voltage can be reduced to improve efficiency without impacting output amplitude.

Using direct polar for several power amplifiers with non-aligned signals, may lead to undesired results because the output amplitudes of the PAs may be distorted. This alignment problem may be known for a single PA and supply modulator. However, if envelope tracking (ET) is used instead, the output amplitude of each power amplifier may not be distorted, provided that the supply modulator was set high enough to accommodate the PA with high or the highest instantaneous output power. The impact of ET in this fashion may not be distortion of the signal, but may be a reduction from the optimal efficiency.

As described herein, envelope tracking may be a suitable technique for many applications including, but not limited to, phased arrays. While supply-modulated systems may require precise or near precise alignment when using direct polar techniques, such may not be the case when using envelope tracking. As such, the system architectures described herein (e.g., in FIG. 3) can be used to provide the efficiency benefits of envelope tracking, without the complexity that would be required for modulating the supply of each power amplifier individually, as shown in FIG. 2.

Referring now to FIG. 1, an example architecture of an envelope tracking system 100 is shown. A baseband signal generator 102 may be communicatively coupled to a baseband signal digital-to-analog converter (DAC) 104 and a power amplifier 112. An envelope signal generator 106 may be communicatively coupled to an envelope signal DAC 108. A supply modulator 110 may be communicatively coupled to envelope signal DAC 108 and power amplifier 112. A power supply of a power amplifier 112 may be dynamically adjusted by supply modulator 110 to reduce excess power dissipation in power amplifier 112. In some systems, baseband signal generator 102 and envelope signal generator 106 may be the same component or be two parts of the same component. An antenna 150 may be communicatively coupled to power amplifier 112 to broadcast an output signal of power amplifier 112.

Supply modulation may improve the efficiency of a power amplifier by dynamically adjusting the drain or collector voltage. It may be used, for example, to improve battery life in cellular handsets and energy efficiency in base stations. Using supply modulation to improve the efficiency of a power amplifier may require a one-to-one relationship between the supply modulator and power amplifier. Envelope tracking may be complex and, as described above, may require multiple DACs and additional driver amplifiers. This can add complexity and cost to a system, especially in a system with multiple power amplifiers and antennas, as shown in FIG. 2.

Figure 2:
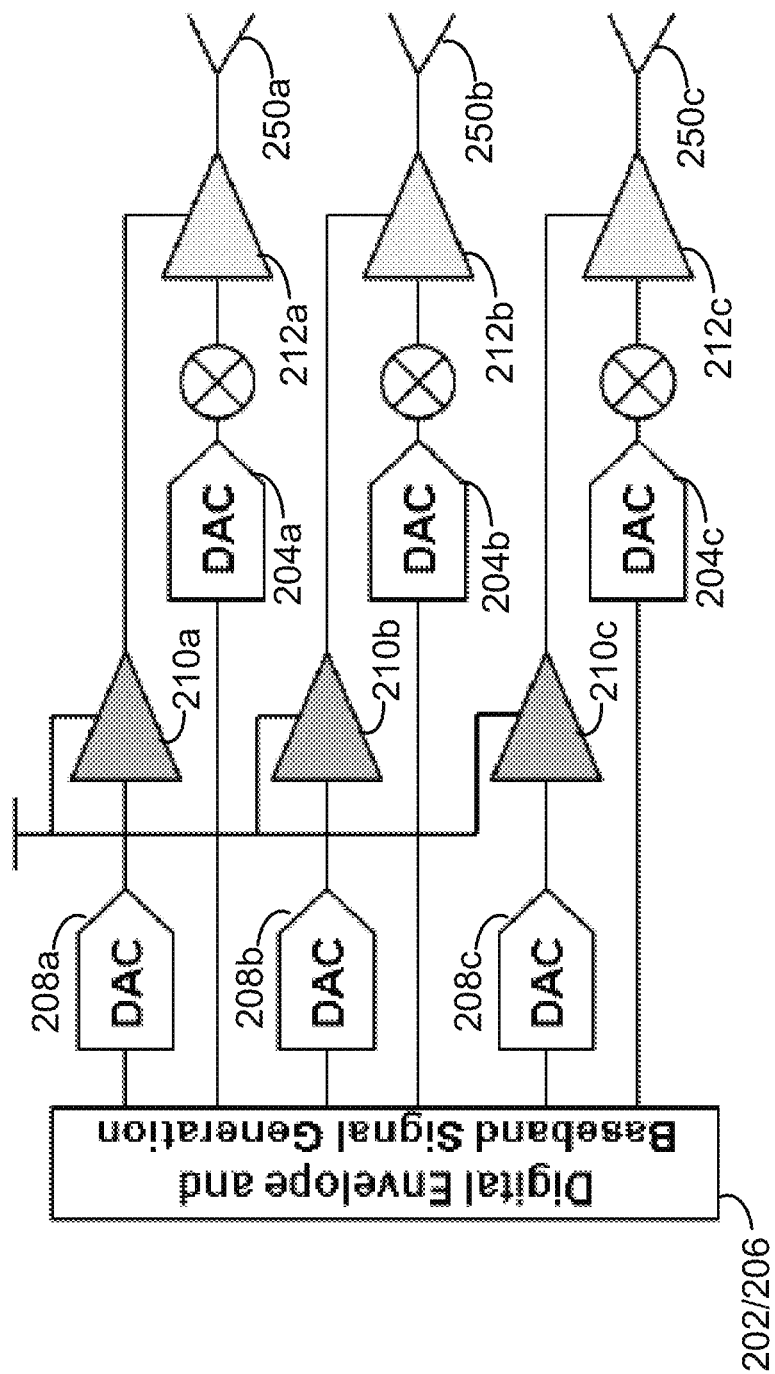
FIG. 2 shows an example architecture of an envelope tracking system for multiple power amplifiers in accordance with the present disclosure.

Referring now to FIG. 2, an example architecture of an envelope tracking system 200 for multiple power amplifiers is shown. A baseband/envelope signal generator 202/206 may be communicatively coupled to a baseband signal DACs 204a, 204b, and 204c, respectively and power amplifiers 212a, 212b, and 212c, respectively. Baseband/envelope signal generator 202/206 may be communicatively coupled to envelope signal DACs 208a, 208b, and 208c. A supply modulator 210a may be communicatively coupled to envelope signal DAC 208a and power amplifier 212a. A supply modulator 210b may be communicatively coupled to envelope signal DAC 208b and power amplifier 212b. A supply modulator 210c may be communicatively coupled to envelope signal DAC 208c and power amplifier 212c. Power supplies of power amplifiers 212a, 212b, and 212c may be dynamically adjusted by supply modulators 210a, 210b, and 210c, respectively, to reduce excess power dissipation in power amplifiers 212a, 212b, and 212c. In some systems, baseband/envelope signal generator 202/206 may be separate components or two parts of the same component. Antennas 250a, 250b, and 250c may be communicatively coupled to power amplifiers 212a, 212b, and 212c, respectively, to broadcast output signals of power amplifiers 212a, 212b, and 212c, respectively.

In systems where more than one power amplifier is needed, as may be the case with active and digital phased arrays, there may be a need for techniques and features to use supply modulation to improve efficiency without overly burdensome complexity as shown in FIG. 2. For example, densely populated phased arrays may require multiple power amplifiers and may be an important application of radar because of their high effective isotropic radiated powers (EIRP) and fast electronic steering. Phased arrays which transmit amplitude modulated signals may require greater power amplifier efficiency. For example, multi-function (e.g., radar, communications, and electronic warfare) and 5G communication arrays may require greater power amplifier efficiency.

As shown in FIG. 2, to use envelope tracking in a system with an array of power amplifiers, additional hardware may need to be added. A system can be scaled directly by the number of elements (e.g., antennas each with their own power amplifier). Scaling in this way may not be a great solution due to increased cost and complexity, but such scaling may be implemented in some systems. For example, in base stations, a small number of elements or antennas (e.g., 8) may exist and designers may not be particularly limited in space. Base stations may be low frequency systems, so scaling may be acceptable in base stations but less acceptable in high frequency phased array systems. At higher frequencies, the physical spacing between elements may be smaller due to shorter wavelengths, which may be inversely proportional to frequency. A typical element spacing in a phased array may be one-half of a wavelength. High frequency phased arrays may have large numbers of elements (e.g., 5000), and could have 5000 or more power amplifiers. Thus, if scaled directly as illustrated in FIG. 2, a phased array designer may need 5000 envelope tracker circuits for envelope tracking to occur at each power amplifier. This may be a big or even insurmountable challenge in terms of cost, complexity, and size considerations of the phased array apparatus. Even in cellular and base station applications, some 5G applications may have hundreds of antennas and/or power amplifier elements.

It should be noted that in some systems, base station stations may use phased array antennas. The terms base station and phased array as used herein are not meant exclude phased array antennas from use in base station systems. Additionally base station antennas may include other types of antennas including but not limited to single 'horn' antenna elements or dish antenna configurations.

Using the techniques and features described in the present disclosure, cost and complexity for using envelope tracking in systems with multiple power amplifiers and antennas may be reduced. For example, an envelope tracker circuit may be shared across multiple power amplifiers. Sharing the envelope tracker circuit may still achieve highly efficient and linear power amplification for a set of power amplifiers instead of doing so for just one power amplifier. Shared envelope tracking may reduce complexity and the number of components required with the added benefit of efficient and linear signal operation for a larger set of power amplifiers.

Figure 3:
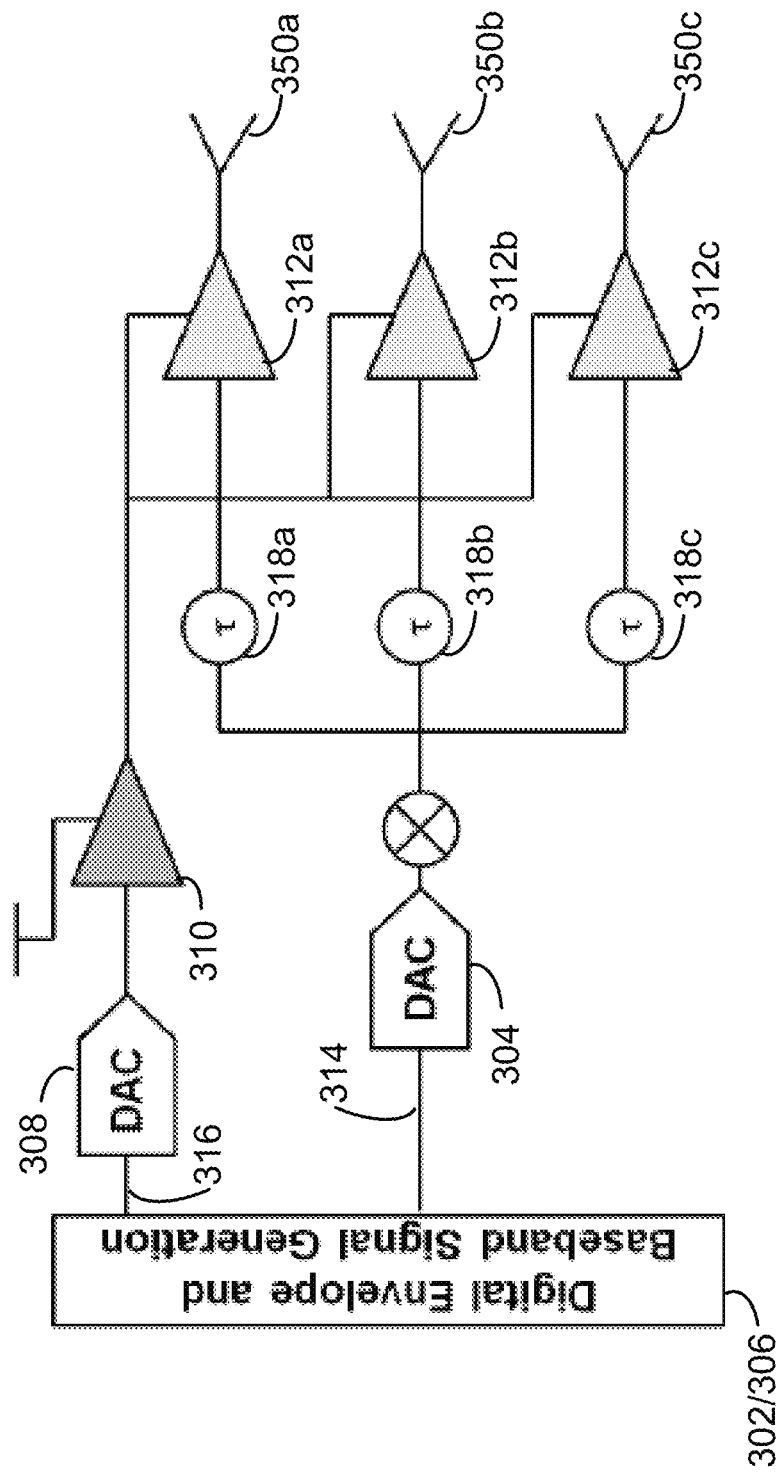
FIG. 3 also shows an example architecture of an envelope tracking system for multiple power amplifiers in accordance with the present disclosure.

Referring now to FIG. 3, in one aspect of the present disclosure, an example system 300 for shared envelope tracking is described. In system 300, a single envelope tracker may be shared among several power amplifiers (in, e.g., a phased array) to improve the efficiency of the amplifiers. Since the envelope tracker is shared, the complexity of the system may be reduced compared to an amplifier array with envelope tracking for each element. This approach may require only two DACs and thus may save cost and reduce complexity.

Figure 7:
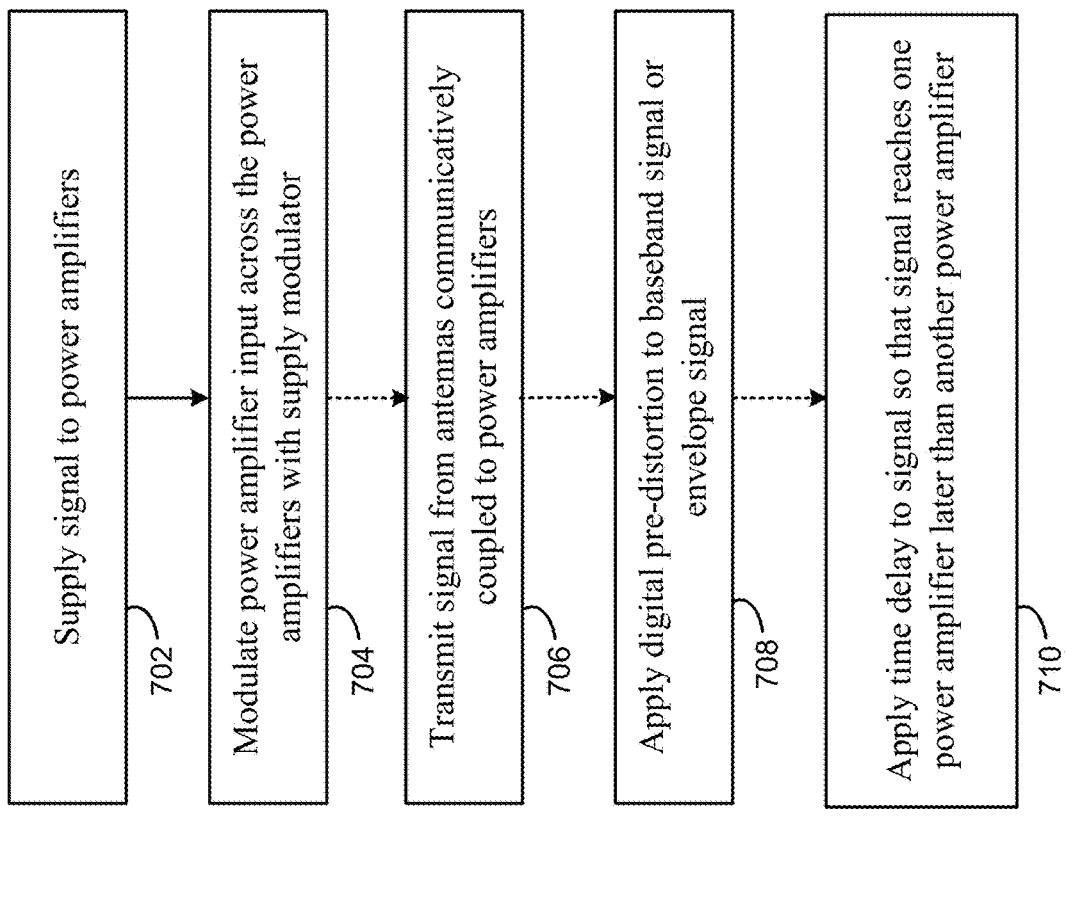
FIG. 7 shows a flow chart of an example process for shared envelope tracking in accordance with the present disclosure.

System 300 may include a baseband/envelope signal generator 302/306 which may be communicatively coupled to a baseband signal DAC 304. Baseband signal DAC 304 may be communicatively coupled to two or more power amplifiers (e.g., power amplifiers 312a, 312b, and 312c). Referring also to FIG. 7, a shared envelope tracking (SET) process 700 is shown. SET process 700 may include supplying (702) a signal to two or more power amplifiers (e.g., power amplifiers 312a, 312b, and 312c). In an implementation, the signal may be supplied by baseband/envelope signal generator 302/306. Additionally, in an implementation, the operation of supplying (702) a signal to two or more power amplifiers may not require that the signal physically reach the two or more power amplifiers, and may only represent that the signal was created or generated by a signal generator (e.g., baseband/envelope signal generator 302/306) for use in one or more of the systems an methods described herein.

It should be noted that FIG. 7 is not intended to convey any required order of operation among the operations 702-710 depicted for SET process 700. FIG. 7 is also not intended to convey that each of the operations 702-710 are required to be performed in order for SET process 700 to be executed. In other words, one or more of operations 702-710 may not be performed during execution of SET process 700 and SET process 700 may still improve power amplifier operation without one or more of operations 702-710 being performed.

Baseband/envelope signal generator 302/306 may also be communicatively coupled to an envelope signal DAC 308. System 300 may further include a supply modulator 310 communicatively coupled to envelope signal DAC 308 and the two or more power amplifiers (e.g., power amplifiers 312a, 312b, and 312c) for shared envelope tracking across the two or more power amplifiers (e.g., power amplifiers 312a, 312b, and 312c). Supply modulator 310 may itself be a power amplifier or driver amplifier. In this way, the power supply of power amplifiers 312a, 312b, and 312c may be dynamically adjusted by supply modulator 310 to reduce excess power dissipation in power amplifiers 312a, 312b, and 312c. Referring also to FIG. 7, SET process 700 may include modulating (704) power amplifier input across the two or more power amplifiers (e.g., power amplifiers 312a, 312b, and 312c) with a supply modulator (e.g., supply modulator 310). In this way, supply modulator 310 may be shared across the two or more power amplifiers (e.g., power amplifiers 312a, 312b, and 312c) for shared envelope tracking.

In an implementation, system 300 may include at least one antenna (e.g., antennas 350a, 350b, and 350c) communicatively coupled to at least one of the two or more power amplifiers (e.g., power amplifiers 312a, 312b, and 312c). Each of the two or more power amplifiers (e.g., power amplifiers 312a, 312b, and 312c) may be communicatively coupled to a separate antenna (e.g., antennas 350a, 350b, and 350c). For example, power amplifier 312a may be communicatively coupled to antenna 350a, power amplifier 31ba may be communicatively coupled to antenna 350b, and power amplifier 312c may be communicatively coupled to antenna 350c.

System 300 may be applied in, for example, a cellular or base station system. In those systems, system 300 may include two or more base station antennas (e.g., antennas 350a, 350b, and 350c). Each base station antenna (e.g., antennas 350a, 350b, and 350c) may be communicatively coupled to at least one of the power amplifiers (e.g., power amplifiers 312a, 312b, and 312c), in a one to one correspondence, for example. System 300 may be applied in, for example, a phased array or radar system. In those systems, system 300 may include two or more phased array antennas (e.g., antennas 350a, 350b, and 350c). Each phased array antenna (e.g., antennas 350a, 350b, and 350c) may be communicatively coupled to at least one of the power amplifiers (e.g., power amplifiers 312a, 312b, and 312c), in a one to one correspondence, for example. Referring now also to FIG. 7, SET process 700 may include transmitting (706) a signal from at least one antenna (e.g., antennas 350a, 350b, and 350c) communicatively coupled to at least one of the two or more power amplifiers (e.g., power amplifiers 312a, 312b, and 312c).

In an implementation, system 300 may also include at least one digital pre-distortion (DPD) element (not shown) in at least one of a baseband signal path 314 associated with baseband/envelope signal generator 302/306 and an envelope signal path 316 associated with baseband/envelope signal generator 302/306. DPD may be applied to a signal prior to the signal reaching baseband signal DAC 304 to offset distortion in the two or more power amplifiers (e.g., power amplifiers 312a, 312b, and 312c). Additionally, DPD may be applied to a signal prior to the signal reaching envelope signal DAC 308 to offset distortion in the two or more power amplifiers (e.g., power amplifiers 312a, 312b, and 312c).

Referring now also to FIG. 7, in an implementation, SET process 700 may include applying (708) digital pre-distortion to a baseband signal (e.g., at baseband/envelope signal generator 302/306) corresponding to a signal supplied to the power amplifiers. Further, in implementation, SET process 700 may include applying (708) digital pre-distortion to an envelope signal (e.g., at baseband/envelope signal generator 302/306) corresponding to the power amplifier input.

The DPD element may represent an implementation of DPD on a digital side before analog conversion (e.g., by a cancelling signal or component). When the signal desired to be transmitted is generated, a distortion may be deliberately added (e.g., by baseband/envelope signal generator 302/306) to compensate for any distortion that the power amplifier (e.g., power amplifiers 312a, 312b, and 312c) will add. This may require testing or otherwise calculating the distortion that the power amplifier will add. In order to cancel the distortion added in the power amplifier, a DPD element (e.g., a cancelling signal or component) may be layered on top of the desired signal (e.g., via baseband/envelope signal generator 302/306). The cancelling signal or component may compensate for and/or cancel out the distortion from the power amplifier. The distortion across even time delayed signals (e.g., as may be used in phased arrays and described below) in the power amplifiers may be similar such that when the cancelling signal or component is distributed out in a multiple power amplifier system, it may still have a benefit of cancelling the distortion in the power amplifiers. In this way, DPD may be implemented across a group of or an array of power amplifiers that share a single digital signal source.

For example, between supply of the baseband signal and the baseband DAC, the DPD element may be added by superimposing, on top of the desired signal, another distortion factor in a way that will offset the distortion that was tested for or calculated in the power amplifier. In other words, a substantially equal and opposite amount of distortion may be added with the signal generator itself once the knowledge of the distortion that will be added by the power amplifier determined. Determining the power amplifier distortion may require advance testing and/or sampling of the power amplifier.

Figure 8:
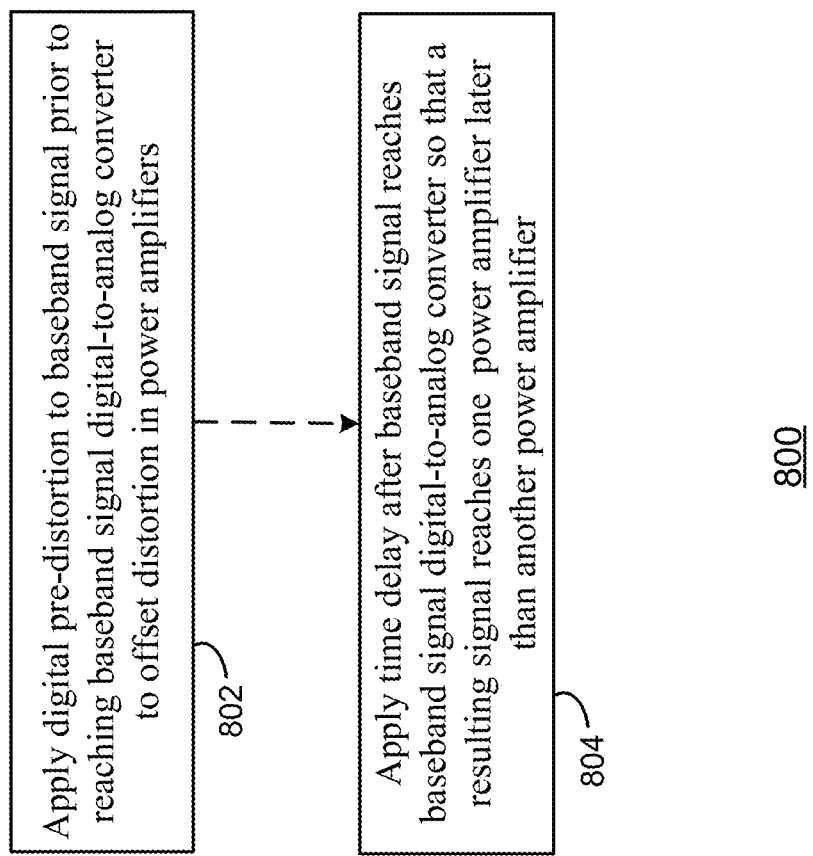
FIG. 8 shows a flow chart of an example process for offsetting distortion in power amplifiers in accordance with the present disclosure.

It should be noted that it is within the scope of the present disclosure to describe systems and methods which improve power amplifier operation by applying DPD without envelope tracking, and/or applying DPD across a group or array of power amplifiers that share a single digital signal source without using envelope tracking. Referring now to FIG. 8, a process 800 for offsetting distortion in power amplifiers is shown. Process 800 may include applying (802) digital pre-distortion to a baseband signal prior to the baseband signal reaching a baseband signal DAC to offset distortion in two or more power amplifiers. Two or more antennas may each be communicatively coupled to at least one of the power amplifiers and/or may be communicative coupled to the two or more power amplifiers in a one to one correspondence. In implementations, process 800 may include applying a time delay after the baseband signal reaches a baseband signal DAC so that a resulting signal reaches one of the two or more power amplifiers later than another of the two or more two or more power amplifiers. The two or more antennas may be least one of base station antennas and phased array antennas.

In a phased array system with multiple antennas and power amplifiers, the power of each of the power amplifiers may be combined together spatially. In other words, N amplifiers may be used in the system to get more power. In these systems, one benefit is superposition of the amplifier output to get increased power. Another benefit is to gain the ability to electronically steer the beam being output from the array of antennas using time delays.

Time delays can be set such that each amplifier/antenna receives the signal to be transmitted in a time-staggered fashion to create a wave and leave the antenna elements with an electronically realized tilt. In this way, a wave can be geometrically tilted and aimed. The array of antennas may create a shift of the signal coming out of the antennas (e.g., 45 or 60 degrees off of the angle perpendicular to the array).

By adjusting the time delay values on the fly, the direction of the signal being transmitted can be changed rapidly without moving parts.

In such systems, each power amplifier may have its own time delay in order to move the main beam around. In some systems, time delay can be provided to groups of elements. The time delay may be created by implementing selectable lines to switch from, each with a choice of different line lengths. Each line may correspond to a certain amount of time delay. The amount of traveling the signal does over each separate line can be used to make the time delay. Longer and longer lines/loops may be added to create greater time delay.

Referring again to FIG. 3, in implementations, at least one time delay element (e.g., time delay elements 318a, 318b, and 318c) may be associated with at least one of the two or more power amplifiers (e.g., power amplifiers 312a, 312b, and 312c). Time delay elements 318a, 318b, and 318c may represent different time delays. In this way, a time delay may be applied to a signal prior to the signal reaching at least one of the two or more power amplifiers. (e.g., power amplifiers 312a, 312b, and 312c). Referring also to FIG. 7, in an implementation, SET process 700 may include applying (710) a time delay to the signal supplied to the power amplifiers so that the signal reaches one of the two or more power amplifiers (e.g., power amplifiers 312a, 312b, and 312c) later than another of the two or more power amplifiers (e.g., power amplifiers 312a, 312b, and 312c). It should be noted that in many systems and applications, the similarity of the time-delayed signals allows for the supply modulator (e.g., supply modulator 310) to be shared across the two or more power amplifiers (e.g., power amplifiers 312a, 312b, and 312c) without a significant decrease in efficiency or signal quality.

Analysis may show that multiple time-delayed power amplifiers can share a single envelope tracker and provide a significant improvement over statically supplied amplifiers. Phased arrays may be a suitable application of this technique. In some systems, a 15 point efficiency improvement over static supply may be realized when amplifying a two-tone signal. Sharing an envelope tracker may be justified when:

$$\frac{1}{2} \gg \frac{\Delta f}{f_0} \sin(\theta)(N-1)$$

where $\Delta t/f_0$ is the fractional bandwidth of the signal, $\theta$ is the maximum steering angle, and N is the number of elements sharing an envelope tracker.

There may be a trade off between aperture size, signal bandwidth, and maximum steering angle for shared envelope tracking in an array. A two-tone signal may be used in an analysis because the tone separation may give a notion of bandwidth, and the signal may be simple to analyze. When N elements in an array transmit a time-delayed, two-tone signal, the signal in the $i^{th}$ PA is $$s_i(t) = \cos(2\pi f_1(t - \tau_i)) + \cos(2\pi f_2(t - \tau_i)) \quad (1)$$
$$= 2\cos(2\pi f_0(t - \tau_i))\cos(2\pi \Delta f(t - \tau_i)) \quad (2)$$

where $$f_0 = \frac{f_1 + f_2}{2}, \Delta f = \frac{f_1 - f_2}{2}, \text{ and } \tau_i$$

is the delay of the $i^{th}$ element. As may normally be the case with any modulation, the carrier frequency, $f_0$, is much higher than the frequency of the envelope signal:

$$e(t) = |2\cos(2\pi \Delta f t)|$$

A phased array with half wavelength separation between elements and steering a beam to angle $\theta$, will have a progressive time delay between elements of:

$$\tau_i = (i-1)\frac{\sin(\theta)}{2f_0}. \quad (3)$$

Figure 4:
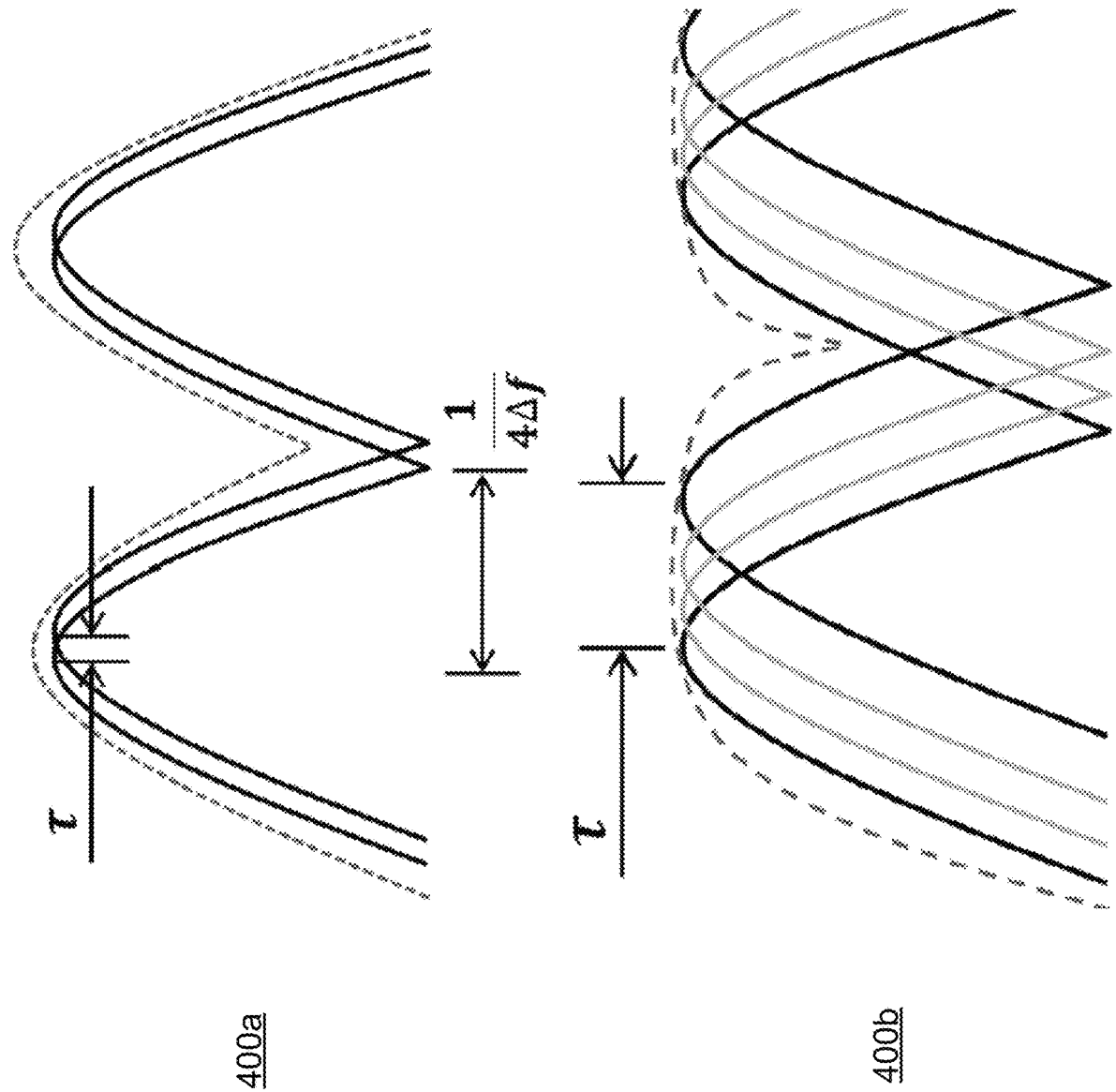
FIG. 4 shows a visual representation of examples of time-delayed envelopes of two-tone signals superimposed with a modulated supply in accordance with the present disclosure.

Referring now to FIG. 4, the envelope of a two-tone signal for two time-delayed amplifiers is shown. Two time-delayed envelopes (solid lines) of two-tone signals superimposed with the modulated supply (dashed line) are shown in 400a. When the delay ($\tau$) is small, the envelope tracker can closely follow both peaks with minimal offset from the smaller signal. As shown in 400b, when the delay approaches the envelope peak-to-null period, the envelope tracker must stay high for a longer portion of the envelope period. This may negatively affect efficiency.

Because the delay is small, the similarity of the two envelopes allows for them to share an envelope tracker with a minimal decrease in efficiency. As the delay grows, the efficiency may degrade further. If it were the case that there were N elements, and the total time delay between the first and Nth element was:

$$\frac{T_{env}}{2} = \frac{1}{4\Delta f}, \quad (4)$$

which is the delay between the peak and null of the envelope, then sharing a supply modulator among all elements may be not make sense. The supply may always need to be at the maximum value and may be equivalent to a static supply. Therefore, it can be said that:

$$\frac{1}{4\Delta f} \gg \frac{\sin(\theta)}{2f_0}(N-1) \quad (5)$$

is the condition to define when sharing a supply modulator is practical. The terms can be rearranged to $$\frac{1}{2} \gg \frac{\Delta f}{f_0} \sin(\theta)(N-1), \quad (6)$$

which gives a sense of the trade off between bandwidth, number of elements, and maximum steering angle. It is noted that λ/2 arrays may already have a bandwidth of less than 10%, and the sine of an angle is always less than one. Although (6) may be a good rule of thumb, it may not quantify the efficiency loss of mismatched envelope signals.

It is within the scope of the present disclosure to provide an efficiency improvement of the envelope sharing technique. Average efficiency of a PA may be defined as:

$$\eta = \frac{\int_T I_1(t)^2 R_L dt}{\int_T 2V_{dd}(t)I_0(t)dt} \quad (7)$$

where $V_{DD}$ is the drain supply voltage, $I_0$ is the DC current drawn by the PA, $I_1$ is fundamental current of the output waveform, $R_L$ is the load seen at the virtual drain of the PA, and T is the period over which the average is calculated. It should be noted that the Fourier series may be used to calculate $I_0$ and $I_1$ by integrating over one period of the carrier frequency. In this measurement, the period is much longer, on a timescale commensurate to the signal envelope. Because our analysis accounts for amplitude modulation, $V_{DD}$, $I_0$ and $I_1$ all vary within T, hence their time dependence in (7). Assume for illustrative purposes that an ideal Class-B amplifier is used with the optimum $R_L=V_{max}/I_{max}$.

A Class-B amplifier has $$I_0 = \frac{A}{\pi I_{max}} \text{ and } I_1 = \frac{A}{2 I_{max}}$$

where $0 \le A \le 1$ is a scalar that relates the fundamental current to the maximum current of the PA. Furthermore, assume $V_{dd}=V_{max}/2$ for a static supply and $V_{dd}=I_1 R_L$ for envelope tracking. When these terms are substituted into (7), it simplifies to:

$$\eta_{static} = \frac{\pi}{4} \frac{\int_T A(t)^2 dt}{\int_T A(t) dt} \quad (8)$$

and $$\eta_{ET} = \frac{\pi}{4} \frac{\int_T A(t)^2 dt}{\int_T A(t)^2 dt} \quad (9)$$

for envelope tracking without a time delay. The result in (9) states that the PA will always have an efficiency of 78%, which may seem too good to be true, and in fact is. This may be due to the lack of a knee voltage in the model. When the knee voltage is accounted for the efficiency is once again amplitude dependent, but much improved over the efficiency of a static supply. However, the knee voltage effects are not included so that the close-for analytical results below may be demonstrated.

The result in (9) may assume that the envelope tracker is set at the optimal level for efficiency and does not account for time delay. To account for time delay, one must calculate $V_{DD}=I'_1 R_L$, where $I'_1$ is the fundamental current of the element with the highest envelope. This supposes that $A(t) \le A'(t) \le 1$ and (9) can be re-written as:

$$\eta_{Shared-ET} = \frac{\pi}{4} \frac{\int_T A(t)^2 dt}{\int_T A(t)A'(t)dt} \quad (10)$$

for a shared supply modulator. This is the general equation that can be used to predict the average efficiency of a power amplifier using envelope tracking, with a non-optimal supply level.

The above can be applied to a two-tone signal. Equation (10) can be used to calculate the efficiency of an arbitrary waveform for a given delay, τ. The efficiency equation may be used to solve for the efficiency of two power amplifiers sharing an envelope tracker, while amplifying a two-tone signal. This signal is chosen because the tone separation gives a notion of bandwidth when compared to the carrier frequency. However, the two-tone signal has a low peak-to-average power ratio (PAPR), so the efficiency savings achieved by envelope tracking may not be as dramatic as it would be for high-PAPR signals, such as OFDM.

The efficiency of a power amplifier for a two-tone signal without envelope tracking may be first calculated, to give a baseline for comparison. Assume Class-B operation for the analysis without, and with shared envelope tracking. The envelope of the signal is a cosine and has a period of π, so (7) can be written as $$\eta = \frac{\pi}{4} \frac{\int_{-\pi/2}^{\pi/2} \cos^2(\phi) d\phi}{\int_{-\pi/2}^{\pi/2} \cos(\phi) d\phi}, \quad (11)$$

assuming that $R_L=V_{max}/I_{max}$ and $V_{max}=2V_{dd}$. When these integrals are performed, the resulting efficiency is:

$$\eta = \pi^2/16 \approx 61.7\%$$

Figure 5:
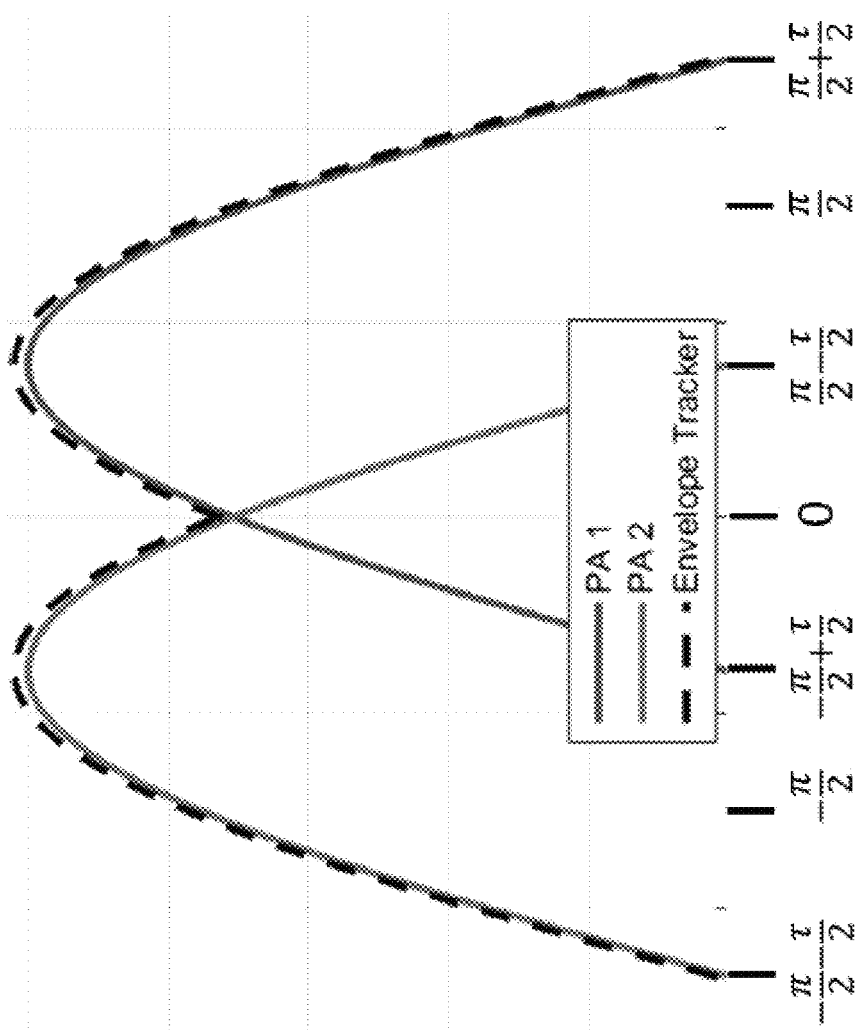
FIG. 5 shows a visual representation of an example of achievable efficiency in power amplifiers in accordance with the present disclosure.

When an envelope tracker is shared between two elements, the output power remains the same, thus the numerator in the efficiency equation is the same. However, the denominator must be calculated to account for the fact that the envelope is not always optimally set. Referring to FIG. 5, PA 1 has an envelope of:

$$\cos(\phi - \tau/2)$$

with a period from:

$$[-\pi/2+\tau/2, \pi/2+\tau/2].$$

For the period:

$$[-/2-\tau/2, 0],$$

PA 2 is the maximum signal and the envelope tracker is set to accommodate its output power. For this period, PA 2 is the more efficient of the two. From:

$$[0, \pi/2+\tau/2].$$

the envelope tracker must be set to accommodate PA 1 since it is the greater of the two signals. With this information, the efficiency for PA 1 can be calculated as $$\eta = \frac{\pi}{4} \frac{\int_{-\pi/2+\tau/2}^{\pi/2+\tau/2} \cos^2(\phi - \tau/2) d\phi}{\left( \int_{-\pi/2+\tau/2}^{0} \cos(\phi - \tau/2)\cos(\phi + \tau/2) d\phi + \int_{0}^{\pi/2+\tau/2} \cos^2(\phi - \tau/2) d\phi \right)}. \quad (12)$$

When the integrals are solved, the efficiency is $$\eta = \frac{\pi}{4} \frac{\pi/2}{\left( \left[ \frac{1}{4}(\sin\tau + (\pi - \tau)\cos\tau) \right]_{-\pi/2+\tau/2}^{0} + \left[ \frac{1}{4}(\tau + \sin\tau + \pi) \right]_{0}^{\pi/2+\tau/2} \right)}. \quad (13)$$

FIG. 5 shows a visual representation of the integration in (12). When solving for the efficiency of PA 1, the power supplied by the modulator is dictated by the power requirements from the PA with a higher output power. For φ<0, PA 2 has a higher power level, while PA 1 has greater power for φ>0.

Figure 6:
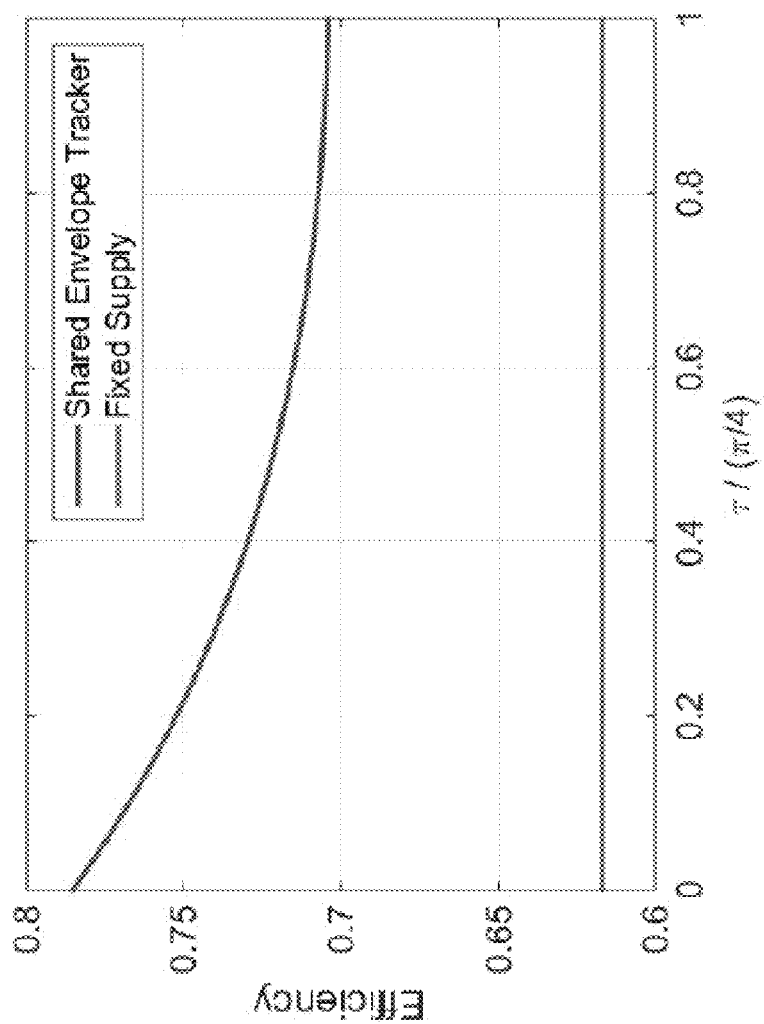
FIG. 6 shows a visual representation of compared efficiency of a power amplifier using a static supply versus a power amplifier using a shared supply in accordance with the present disclosure.

The delay-dependent results of (13) are shown in FIG. 6. FIG. 6 shows a comparison of the efficiency of a power amplifier using a static supply to a shared supply. There may be a 16-point improvement for small delays, which decreases as the delay is increased. For small delays, the efficiency approaches the peak theoretical efficiency of 78.5%. As the delay is increased, the efficiency monotonically decreases. Even at the worst case delay, there is almost 10 points of efficiency improvement over a statically supplied amplifier. The two-tone signal has a low peak-to-average power ratio (PAPR), the efficiency improvement may be even better for signals with higher PAPR.

It should be noted that FIG. 6 plots the efficiency all the way out to π/4, the point where the rule of thumb states zero improvement over static supplied. The reason there seems to be a contradiction is because (13) only calculates for two amplifiers sharing an envelope tracker. Adding more PAs would need to account for other peaks in the envelope and would decrease the efficiency for longer delays.

It has been shown that envelope tracking can be used in phased arrays to improve efficiency. The architectures described herein may be useful to designers of multi-function and 5G arrays. Improvement over an array with a static supply for a two-tone signal has been shown, however, this improvement may be more dramatic for high peak-to-average power ratio signals.

While the present disclosure has been shown and described with reference to specific embodiments, examples, and implementations, it should be understood by those skilled in the art that various changes in form and detail may be made therein without departing from the spirit and scope of the present disclosure.

What is claimed is:

1. A shared envelope tracking system comprising:
   a baseband signal generator communicatively coupled to a baseband signal digital-to-analog converter, the baseband signal digital-to-analog converter communicatively coupled to two or more power amplifiers;
   an envelope signal generator communicatively coupled to an envelope signal digital-to-analog converter; and
   a supply modulator communicatively coupled to the envelope signal digital-to-analog converter and the two or more power amplifiers for shared envelope tracking across the two or more power amplifiers.

2. The system of claim 1, further comprising:
   at least one antenna communicatively coupled to at least one of the two or more power amplifiers.

3. The system of claim 1, wherein each of the two or more power amplifiers is communicatively coupled to a separate antenna.

4. The system of claim 1, further comprising:
   at least one digital pre-distortion element in at least one of:
      a baseband signal path associated with the baseband signal generator; and
      an envelope signal path associated with the envelope signal generator.

5. The system of claim 1, wherein digital pre-distortion is applied to a signal prior to the signal reaching the baseband signal digital-to-analog converter to offset distortion in the two or more power amplifiers.

6. The system of claim 1, wherein digital pre-distortion is applied to a signal prior to the signal reaching the envelope signal digital-to-analog converter to offset distortion in the two or more power amplifiers.

7. The system of claim 1, wherein at least one time delay element is associated with at least one of the two or more power amplifiers.

8. The system of claim 1, wherein a time delay is applied to a signal prior to the signal reaching at least one of the two or more power amplifiers.

9. The system of claim 1, further comprising:
   two or more base station antennas, each base station antenna communicatively coupled to at least one of the power amplifiers.

10. The system of claim 1, further comprising:
    two or more phased array antennas, each phased array antenna communicatively coupled to at least one of the power amplifiers.

11. A method for shared envelope tracking comprising:
    supplying a signal to two or more power amplifiers with a baseband signal generator communicatively coupled to a baseband signal digital-to-analog converter, the baseband signal digital-to-analog converter communicatively coupled to the two or more power amplifiers;
    modulating power amplifier input across the two or more power amplifiers with a supply modulator communicatively coupled to an envelope signal digital-to-analog converter and the two or more power amplifiers for shared envelope tracking; and
    wherein the supply modulator is shared across the two or more power amplifiers for shared envelope tracking.

12. The method of claim 11, further comprising:
    transmitting the signal from at least one antenna communicatively coupled to at least one of the two or more power amplifiers.

13. The method of claim 11, further comprising:
    applying digital pre-distortion to at least one of:
       a baseband signal corresponding to the supplied signal; and
       an envelope signal corresponding to the power amplifier input.

14. The method of claim 13, wherein digital pre-distortion is applied to the baseband signal prior to the baseband signal reaching a baseband signal digital-to-analog converter to offset distortion in the two or more power amplifiers.

15. The method of claim 13, wherein digital pre-distortion is applied to the envelope signal prior to the envelope signal reaching the envelope signal digital-to-analog converter to offset distortion in the two or more power amplifiers.

16. The method of claim 11, further comprising
    applying a time delay to the signal so that the signal reaches one of the two or more power amplifiers later than another of the two or more two or more power amplifiers.

17. The method of claim 12, wherein the at least one antenna is at least one of a base station antenna and a phased array antenna.

18. A method for offsetting distortion in power amplifiers, the method comprising:
  applying digital pre-distortion to a baseband signal prior to the baseband signal reaching a baseband signal digital-to-analog converter to offset distortion in two or more power amplifiers, wherein two or more antennas are each communicatively coupled to at least one of the power amplifiers; and
  applying a time delay after the baseband signal reaches the baseband signal digital-to-analog converter so that a resulting signal reaches one of the two or more power amplifiers later than another of the two or more two or more power amplifiers.

19. The method of claim 18, wherein the two or more antennas are least one of base station antennas and phased array antennas.

* * * * *